United States Patent
Bures et al.

(10) Patent No.: US 8,038,858 B1
(45) Date of Patent: Oct. 18, 2011

(54) COAXIAL PLASMA ARC VAPOR DEPOSITION APPARATUS AND METHOD

(75) Inventors: Brian L. Bures, Alameda, CA (US);
Jason D. Wright, San Mateo, CA (US);
Michael Y. Au, Fremont, CA (US);
Andrew N. Gerhan, Oakland, CA (US);
Mahadevan Krishnan, Oakland, CA (US)

(73) Assignee: Alameda Applied Sciences Corp, San Leandro, CA (US)

( * ) Notice: Subject to any disclaimer, the term of this patent is extended or adjusted under 35 U.S.C. 154(b) by 1037 days.

(21) Appl. No.: 11/268,167

(22) Filed: Nov. 7, 2005

Related U.S. Application Data (63) Continuation-in-part of application No. 10/834,592, filed on Apr. 28, 2004, now Pat. No. 7,867,366.

(51) Int. Cl.
*C23C 14/54* (2006.01)
(52) U.S. Cl. .............. 204/298.14; 204/298.21
(58) Field of Classification Search ............. 204/298.21, 204/298.14
See application file for complete search history.

(56) References Cited

U.S. PATENT DOCUMENTS

| | | | |
|---|---|---|---|
| 2,972,695 A | 2/1961 | Wroe | |
| 3,625,848 A | 12/1971 | Snaper | |
| 3,783,231 A | 1/1974 | Sablev et al. | |
| 4,492,845 A | 1/1985 | Kljuchko | |
| 4,609,564 A | 9/1986 | Pinkhasov | |
| 4,629,547 A * | 12/1986 | Honda et al. | 204/192.15 |
| 4,724,058 A | 2/1988 | Morrison | |
| 4,849,088 A | 7/1989 | Veltrop et al. | |
| 4,859,489 A | 8/1989 | Pinkhasov | |
| 4,960,753 A * | 10/1990 | Collins et al. | 204/298.06 |
| 5,037,522 A | 8/1991 | Vergason | |
| 5,269,898 A | 12/1993 | Welty | |
| 5,306,408 A | 4/1994 | Treglio | |
| 5,354,963 A | 10/1994 | Muller et al. | |
| 5,407,548 A * | 4/1995 | Kopacz et al. | 204/192.15 |
| 5,811,022 A * | 9/1998 | Savas et al. | 216/68 |
| 5,908,602 A | 6/1999 | Bardos et al. | |
| 5,976,636 A | 11/1999 | Leu et al. | |
| 6,767,436 B2 * | 7/2004 | Wei | 204/192.3 |
| 2004/0134770 A1 * | 7/2004 | Petersen | 204/192.38 |

* cited by examiner

*Primary Examiner* — Keith D Hendricks
*Assistant Examiner* — Jason M Berman
(74) *Attorney, Agent, or Firm* — File-EE-Patents.com; Jay A. Chesavage (57) ABSTRACT

An apparatus for deposition of plasma reaction films includes a substrate for the deposition of either thin or thick films. The substrate also allows for a film deposition which adheres to the substrate, and also films which may be removed after deposition. The cathode may be fabricated from individual wires, or it may be fabricated from a single conductor. A macro-particle filter which preferentially traps larger particles may be introduced between a porous cathode and the deposition surface. The macro-particle filter may also carry electrical current as is useful for generating a magnetic field such that a Lorentz force acts preferentially on ionized particles, allowing them to pass through the filter while trapping macroparticles that are not influenced by the magnetic field.

38 Claims, 6 Drawing Sheets

*Figure 1*

*Figure 2*
section a-a

*Figure 3*

*Figure 4*
section b-b

*Figure 5*
detail C

Figure 9a
section a-a

Figure 9b
section a-a

*Figure 9c*
section a-a

*Figure 9d*
section a-a

*Figure 9e*
section a-a

*Figure 9f*

*Figure 10*
detail C

COAXIAL PLASMA ARC VAPOR DEPOSITION APPARATUS AND METHOD

This application is a continuation-in-part of application Ser. No. 10/834,592 filed on Apr. 28, 2004 now U.S. Pat. No. 7,867,366.

FIELD OF THE INVENTION

The invention pertains to the use of a rotating plasma for the deposition of ceramic and metal materials onto a conductive cylindrical surface. In particular, the composition of the deposition over the inner surface of a cylinder may be controlled such that the composition of the coating may be varied through the thickness of the coating.

BACKGROUND OF THE INVENTION

This invention relates generally to the coating of substrates using vacuum arc evaporation, and more particularly to an improved method and apparatus that employs a cylindrical metallic cathode and a magnetic field interacting with a plasma arc to cause the plasma arc to follow a helical trajectory on the surface of the cylindrical cathode.

Vacuum arc evaporation can be used for deposition of metal, alloy, and metal compound coatings. A cathode composed of the material to be deposited is vaporized by a high current, low voltage arc plasma discharge in a vacuum chamber, which has been evacuated to a pressure of typically $10^{-4}$ Torr or less. The substrates to be coated are placed in the vacuum chamber facing the evaporable surface of the cathode, at a distance of typically 10-50 cm. Typical arc currents range between 25 and 500 amperes, with voltages between 15 and 50 volts. The arc discharge occurs between an anode terminal and a cathode terminal in the partially evacuated chamber, resulting in a metal vapor plasma created by vaporization and ionization of the cathode material by the arc. The cathode, or negative electrode, is an electrically isolated structure which is at least partially consumed during the process. The anode, or positive electrode, comprises a cylinder disposed around the cathode. An arc is initiated on the evaporable surface of the cathode by means of mechanical contact, high voltage spark, or laser irradiation. The ensuing arc plasma discharge is highly localized in one or more mobile arc spots on the cathode surface, but is distributed over a large area at the anode. The extremely high current density in the arc spot, estimated to be $10^{10}$-$10^{12}$ amperes/m$^2$, results in local heating, evaporation, and ionization of the cathode material. Each arc spot emits a jet of metal vapor plasma in a direction approximately perpendicular to the cathode surface, forming a luminous plume extending into the region between the cathode and anode, where the substrates to be coated are disposed. The metal vapor condenses on the substrate surface, forming a dense coating. Reactive gases may be introduced into the vacuum chamber during the evaporation process, resulting in the formation of metal compound coatings on the substrate surface.

When the arc current is below 70-100 amperes, depending on the material, only a single arc spot will exist. At higher arc currents, multiple arc spots exist simultaneously, each carrying an equal fraction of the total arc current. An arc spot, in the absence of applied magnetic fields, tends to move rapidly and semi-randomly around the target surface, leaving a trail of microscopic crater-like features on the target surface. Although the small-scale motion of the arc is a semi-random jumping from crater site to crater site, the electromagnetic force due to the interaction between the current in the arc jet and any magnetic field present at the cathode surface has a dominant influence on the large-scale average movement of the arc spot. An externally applied magnetic field causes a force on the arc jet in a direction perpendicular to both the field lines and the jet. In the absence of an applied magnetic field, the interaction of the current in the arc jet with the self-magnetic field caused by the arc current flowing through the cathode can tend to draw the arc spot toward the current input, if the current flow through the cathode is asymmetrical. The direction of the motion of the arc in a magnetic field is opposite or retrograde to the vector J×B direction expected based on Ampere's law, considering the current to be in the same direction as in the external circuit.

An undesirable side effect of the vaporization of the target material at the arc spot is the generation of droplets of molten target material, which are ejected from the target by the reaction forces due to expansion of the vapor jet. These droplets are called macro-particles, and range in diameter from sub-microns to tens of microns. The macro-particles become imbedded in the coating when they land on the substrate, forming objectionable irregularities. Various strategies have been devised to reduce the generation of macro-particles or to prevent their arrival at the substrate. The problem of macro-particles is particularly acute at the point of arc initiation at the start of the helical trajectory, and also at the terminus of the helical trajectory where the arc extinguishes.

U.S. Pat. No. 2,972,695 describes magnetic stabilization of a vacuum arc used for evaporation deposition including a coaxial deposition geometry. U.S. Pat. No. 3,625,848 describes an arc evaporation apparatus with certain electrode configurations and also teaches the use of a magnetic field to increase the evaporation rate and to direct ions to the substrate. U.S. Pat. No. 3,783,231 describes the use of a magnetic field activated when the arc spot moves off the desired evaporation surface of the cathode. U.S. Pat. Nos. 4,724,058 and 4,849,088 each describe an arc evaporation apparatus using a magnetic field in the shape of a closed loop tunnel, which confines the arc spot to a closed loop circular trajectory at a fixed location on the cathode surface. In order to uniformly erode the entire target surface, it is necessary to move the magnetic field generating means to move the arc trajectory over the target surface, either by mechanical movement of the magnet means as described in U.S. Pat. Nos. 4,849,088, 5,908,602, and 5,306,408 or by use of multiple electromagnets, as described in U.S. Pat. No. 4,724,058.

U.S. Pat. No. 4,492,845 describes an arc evaporation apparatus using an annular cathode, in which the evaporable surface is the outer wall, facing a cylindrical anode of larger diameter and greater length than the cathode. The substrates to be coated are disposed inside the annular cathode, not facing the evaporable surface. A coaxial magnetic field is described for diverting charged particles of evaporated material away from the anode and back toward the substrate to be coated.

U.S. Pat. No. 4,609,564 describes a coaxial deposition system without the use of an external magnetic field, and includes cathode temperature control. The problem of tapered material deposition is also discussed.

U.S. Pat. No. 4,857,489 discloses a coaxial coating system for bottles. This system includes a cathode, an anode comprising the object to be coated, a heating source for the anode, an evacuation system, and a source of nitrogen gas.

U.S. Pat. No. 5,037,522 describes the use of a cathode in the form of a long cylinder or rod, which makes use of the self-magnetic field of the arc current to force motion of the arc along the length of the cathode. The direction of the arc's travel on the cathode may be reversed by switching the power supply connection from one end of the cathode to the other.

U.S. Pat. No. 5,269,898 describes a system for an arc evaporation coating chamber where an arc between a coaxial inner cathode and outer anode traverses a helical path which may be altered by either feeding the cathode with a balanced current from each end, or by applying a magnetic field coaxial to the anode and varying the current generating the magnet field, thereby varying the speed of helical movement of the arc down the cathode. The magnetic field generator is inside the evacuated chamber, disposed about the cathode, and with the anode outside the extent of the objects being coated.

U.S. Pat. No. 4,859,489 describes a system for coating a cylindrical bottle using a plasma arc in the presence of an inert gas. U.S. Pat. No. 5,037,522 describes a coaxial system of an anode and cathode, whereby the arc that is struck is used to make uniform coatings on the inner surface of a cylindrical tube placed between an anode and cathode. In both of these systems, the current drawn through the inner cathode is responsible for the creation of a magnetic field, which causes the arc to travel a helical trajectory along the inner conductor.

U.S. Pat. No. 5,354,963 describes a surface heat treatment using a plasma arc in the presence of an inert gas and a magnetic field for controlling the direction of the plasma.

U.S. Pat. No. 5,976,636 describes a plasma arc plating system including helical coils for the direction of the plasma towards the items to be plated.

While the prior art describes the use of either varying magnetic fields or changing the applied electric arc current to change of rate of deposition in a coaxial ion deposition system, it is desired to control the thickness of material deposited, and to control the composition of the material deposited along the axis of the object being coated. Additionally, it is desired to provide for a uniform coating thickness over the extent of the object, as well as at the point of arc initiation and arc termination.

OBJECTS OF THE INVENTION

A first object of the invention is an apparatus for the deposition of a variable thickness of a cathode material onto a cylindrical anode in the presence of a gas by varying the pressure of the gas.

A second object of the invention is an apparatus for the deposition of the reaction product formed by a plasma comprising ions released by a cathode reacting with a gas, said reaction products depositing onto a cylindrical anode, whereby the reaction stoichiometry is varied by changing the pressure of the gas.

A third object of the invention is a removable cap disposed on at least one end of the object to be coated whereby macro-particles and other non-uniformities associated with the start and end of the plasma arc are deposited on the removable caps rather than the object to be coated.

SUMMARY OF THE INVENTION

A cylindrical conductor 102, also referred to as an anode, having a central axis 106 is placed in a magnetic field 110 coaxial to this central axis 106. A cathode 104 is placed inside the anode 102, and the cathode 104 is positioned on or near the central axis 106 of the cylindrical anode 102, where the cathode 104 has an extent larger than the extent of the anode 102. A plasma arc is initiated between the central cathode 104 and the outer cylindrical conductor anode 102, and the direction of the plasma maintains a generally radial geometry from cathode 104 to anode 102. An external magnetic field 110 in combination with the movement of plasma ions causes an azumithal and axial Lorentz force, which causes the plasma to temporally follow a helical path 120, advancing in radial angle about the central axis 106 while advancing down the central axis 106. The ionic particles of the plasma are deposited on the anode 102 while the plasma advances down the central axis 106. When the plasma arc is initiated from a starting point 116, it travels this helical trajectory along the central axis 106 of the anode 102 to an end point 118. Over successive deposition cycles, the gas pressure of the chamber 124 is varied, causing the chemical composition of reaction product of the gas and the cathode material which is deposited on the anode to vary according to the gas pressure variation. By varying the gas pressure over many deposition cycles, the composition of the material deposition may be varied, thereby providing a linear gradation, or any other type of deposition profile desired.

DETAILED DESCRIPTION OF THE INVENTION

Figure 1:
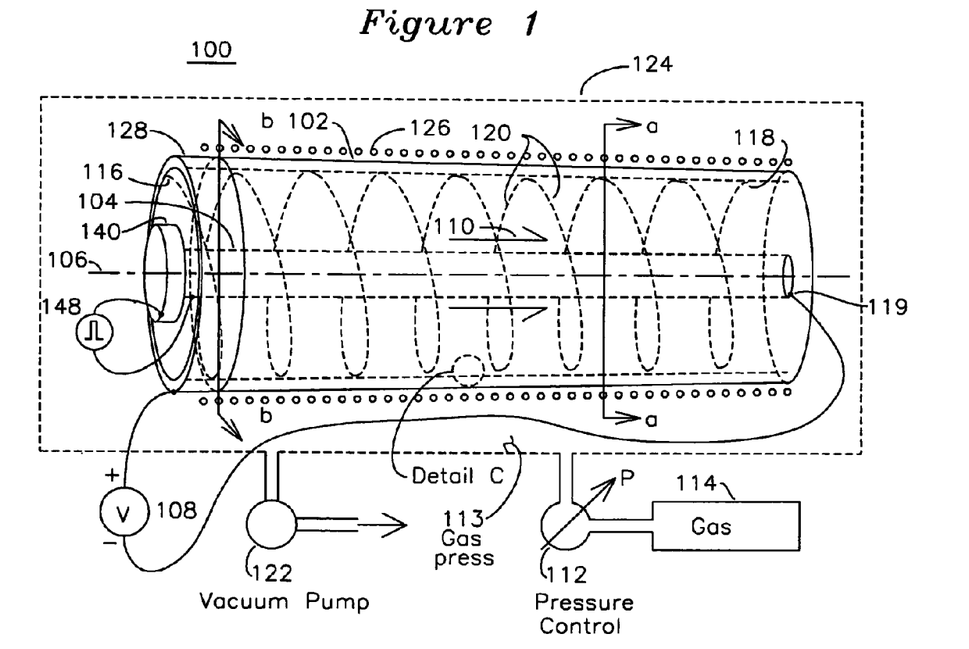
FIG. 1 shows a perspective view of a coaxial plasma arc deposition system.

FIG. 1 shows a coaxial plasma arc deposition system 100, comprising a chamber 124, a vacuum pump 122, a source of gas 114, a pressure control valve 112, and a cylindrical anode 102, which is to have an inner surface coated by material contributed by a cathode 104. Surrounding the anode 102 is a magnetic B field 110 generated by coil 126 which creates a magnetic field 110 parallel to the central axis 106. Placed substantially on the central axis 106 is the cathode 104, which is formed from the material to be deposited on the inside of the anode 102. A voltage source 108 is applied with a positive potential on the anode 102 and a negative potential on the cathode 104. A plasma arc initiator 140 initiates a plasma arc near a start point 116 on one end of the anode 102, and once initiated, the plasma follows a helical path 120 until it reaches end point 118 on the opposite end of the anode 102. The pitch and speed of the resulting helical arc path is governed by the strength of magnetic field 110 generated by magnetic field generator coil 126.

Figure 2:
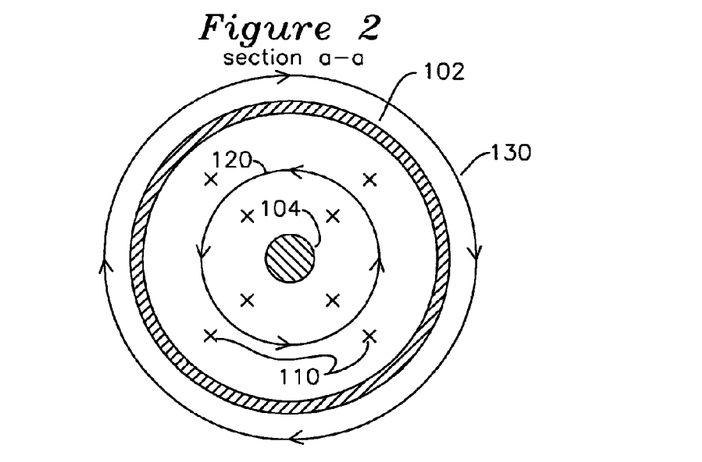
FIG. 2 shows a cross section view of the deposition system of FIG. 1.

FIG. 2 shows a cross section view a-a of FIG. 1, including the anode 102, cathode 104, and magnetic field 110, which may be generated by current 130 flowing in coil 126 of FIG. 1. The direction of helical path 120 tends to be opposite the direction expected from J×B electrostatics.

Figure 3:
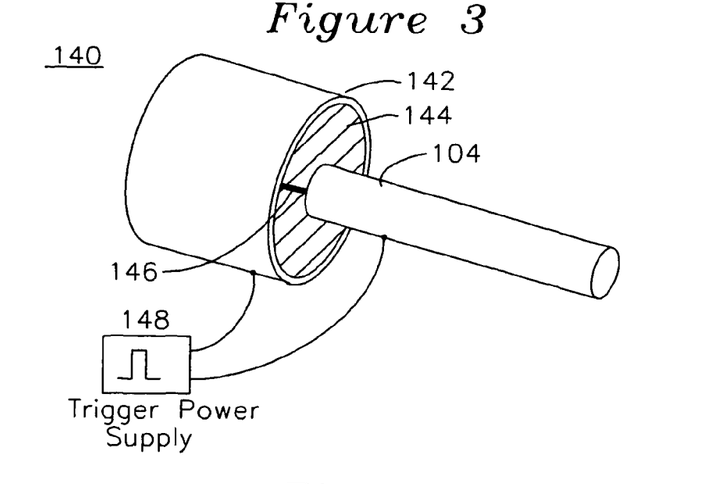
FIG. 3 shows the ignition starter for the plasma arc deposition system of FIG. 1.

FIG. 3 shows the plasma arc initiator 140 of FIG. 1. The plasma arc initiator 140 comprises a cylindrical electrode 142 separated from the cathode 104 by an insulating separator 144 that is coated on the front surface with a conducting material. The application of an instantaneous trigger voltage from trigger power supply 148 causes a localized plasma or initiation arc 146 which forms and spreads after removal of the trigger potential to anode 102 of FIG. 1. The plasma arc initiator 140 may take any form that involves the generation of an initiation arc 146 using a trigger voltage from trigger power supply 148 applied between the cathode 104 and initiation arc 146. The arc preferably forms on the surface of separator 144, which is an insulating material.

Figure 4:
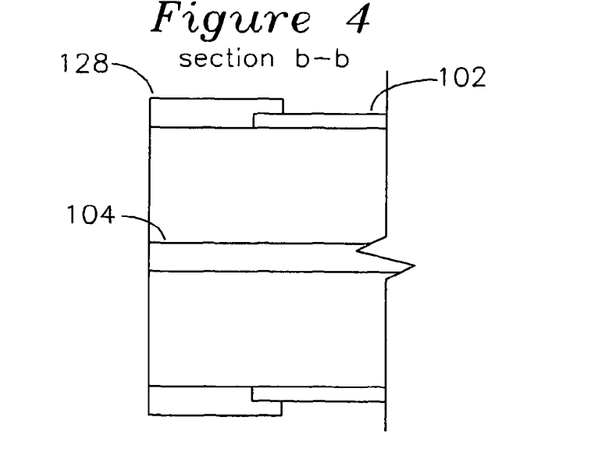
FIG. 4 shows a removable end cap for the deposition system of FIG. 1.

FIG. 4 shows the detail of an end cap 128, which may be applied to the plasma arc initiator 140 of FIG. 1 end of the anode 102, as shown, or to the electrode 119 end of the anode 102. When the plasma arc starts at the plasma arc initiator 140 of FIG. 1, the generated plasma tends to be non-uniform, and may include macro-particles, which are particles larger than desired, which deposit on the anode 102. These result in a non-uniform coating on the initiator end of the anode 102, and may also appear on the electrode 119 of FIG. 1 end of the anode 102. The end cap 128 represents a continuously conductive but removable part of the anode 102, such that the initiation and termination of the plasma arc does not result in non-uniform deposition or excessive macro-particle deposition on the anode 102, but instead these particles appear on the removable end cap 128 on the initiator end and on a removable end cap on the electrode end (not shown). The end caps may optionally be placed on the plasma arc initiator 140 end of anode 102, on the electrode 119 end of anode 102, or on both ends. The joints must have continuous conductivity, which may be achieved through the use of conductive gasket material (not shown) applied in the interface between end cap 128 and anode 102.

Figure 5:
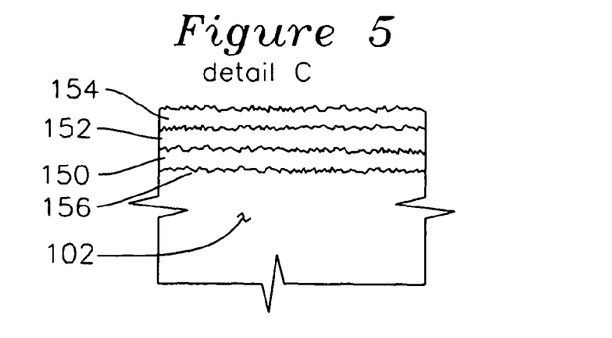
FIG. 5 shows a detail cross-section view of the cylindrical anode having several successive depositions.

FIG. 5 shows a magnified cross section view of the inner surface of anode 102, noted as detail C of FIG. 1. The results of a first plasma arc deposition are shown as initial deposition 150, and subsequent depositions 152 and 154 are shown above this. There may be any number of successive depositions, and the deposition material composition of each deposition layer 150, 152, 154 may be varied by changing the gas pressure 113 of FIG. 1 during each deposition cycle. For example, initial deposition 150 could be formed when the cathode 104 is a tantalum (Ta) electrode and the anode 102 is steel, and the gas is methane (CH4), forming TaC under the reaction Ta+CH$_4$ ⇌ TaC+2H$_2$. In this example, a starting pressure of 100 mTorr would generate an initial deposition 150 of 100% TaC and 0% Ta, with the gas pressure tapering to 10-5 mTorr, where the deposition 154 would be 0% TaC and 100% Ta. By tapering the pressure of the gas over successive deposition events, it is possible to generate coatings with gradation of composition from the surface deposition 154 to the underlying base material of anode 102. There are typically many deposition coatings applied, although 3 deposition coatings are shown for clarity.

The cathode 104 may contain at least one of the following materials: Chromium (Cr), Molybdenum (Mo), Niobium (Nb), Rhenium (Re), Tantalum (Ta), Titanium (Ti), or Tungsten (W), which produces a deposition product of the same material in the absence of a gas which reacts with the cathode material in plasma. Where a reactive gas is present, the reaction product formed by the cathode 104 and the introduced gas in a plasma may be any of the products of reaction: TaN, TaC, TiN, CrN, Al$_2$O$_3$, or W$_2$C. These are given as examples only, and are not intended to limit the invention to these cathode materials or reaction products. Further, it is clear that many different gasses may be introduced which form these reaction products, including Nitrogen, Oxygen, Methane, and many others.

Among the additional gasses which may prove useful are carbon based gasses such as acetylene and benzene, which can be used to generate carbides, as well as gasses which are products of fluorine, such as tetrafluoromethane, nitrogen trifluoride, and pure fluorine gas. Additional cathode materials suitable for reactions are the class of pure materials and the class of alloys. Among the pure materials suitable for cathode reaction with a gas are magnesium, boron, and tin, which may be used in combination, or individually. Suitable alloys include sintered powders as used in superconductors, and include the intermetallics, Nb$_3$Sn, NbTi, Magnesium Diboride, and TaW, which may be used in commonly available 2.5% or 10% alloy form.

The structure of the cathode 104 may be formed as a homogenous rod of a single material type, or it may be formed from a plurality of individual rods of a particular material, or the rods forming the cathode may include several different types of rod materials. The rods may be electrically isolated from each other beyond a common terminal end 140, or they may be electrically continuous. In this manner, it may be possible to form coatings which are combinations of materials otherwise not commercially available.

Figure 8:
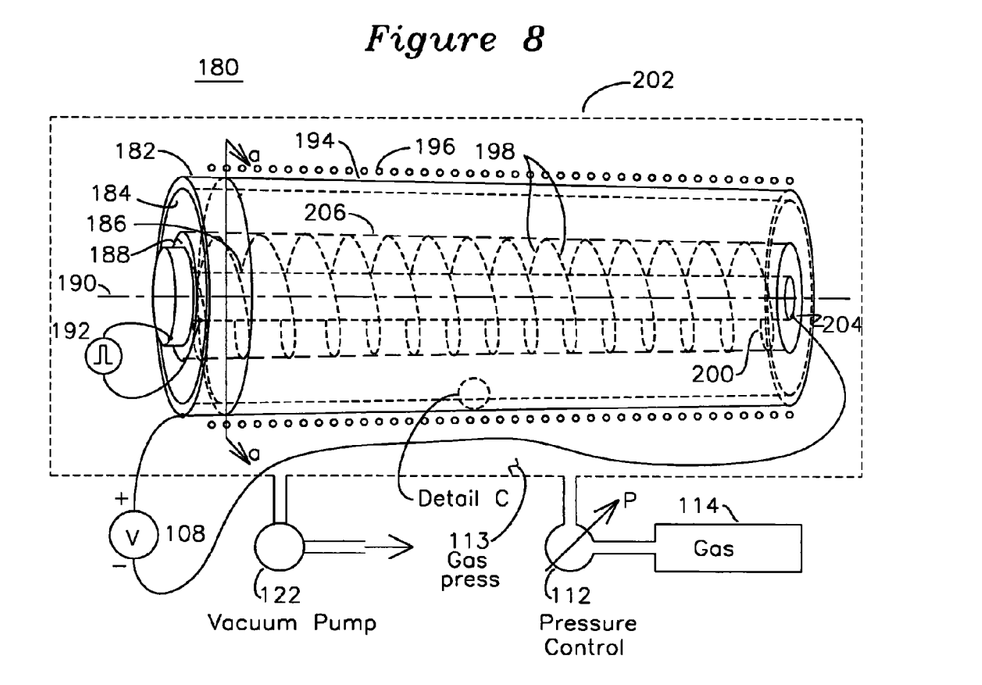
FIG. 8 shows an alternative embodiment of a vapor deposition apparatus.

FIG. 8 shows an alternative embodiment of the vapor deposition apparatus of FIG. 1. As before, a partial vacuum is drawn 122, and reactive gas 114 is introduced into the chamber via pressure control 112. A voltage 108 which may be constant or pulsatile is developed between a cathode 186 and an anode 206, which is a porous screen mesh, a plurality of individual wires, or any conductive material which allows the particles of the plasma to continue beyond the extent of the anode 206 to a deposition surface 184. The plasma is initiated at a distant end from the cathode attachment 204 by initiator 188, such as was described in FIG. 3 in combination with a high voltage pulse generator 192. An axial magnetic field is generated by coil 196, which causes the helical trajectory 198, as before.

Figure 9A:
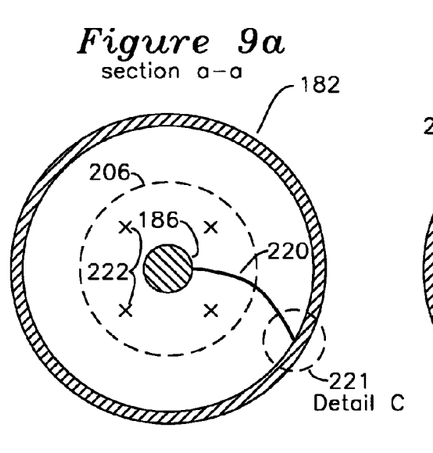
FIG. 9a shows a cross section view of an embodiment of FIG. 8 including a porous anode.
Figure 10:
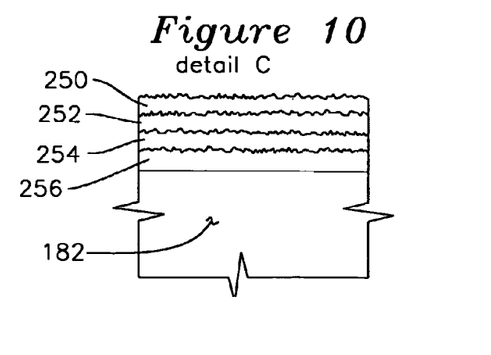
FIG. 10 shows a substrate suitable for removal of the deposited material.

FIG. 9*a* shows a cross section view of the apparatus of FIG. 8. The cathode 186 generates a plasma arc 220 with current flow from cathode 186 to porous anode 206, and the accelerated plasma particles continue beyond the extent of the porous anode 206 to the deposition surface of substrate 182, shown in detail C 221 of FIG. 3 for an adhesive substrates or FIG. 10 for a non-adhesive substrate for use in removing deposition material. The magnetic field 222 causes the plasma arc to rotate radially about the center of cathode 186, and also down the axis of the cathode 186 in a helical trajectory 198 as shown in FIG. 8 and as was described for FIG. 1. Detail C 221 is illustrated in FIG. 5 for the case of a deposition surface where it is desired to mechanically bond material to the substrate 102 or 182 in successive layers, corresponding to the substrate 182 of FIG. 9*a*. Alternatively, it may be desired to be able to extract the layer of deposited material from the substrate 182, in which case it may be preferred to use a substrate 182 with a smooth surface as shown in FIG. 10. In FIG. 10, the successive deposition layers 256, 254, 242, 250 bond to each other through the mechanical roughness of the surface of each coating, but bonding to smooth surface on substrate 182 is weak, thereby enabling the removal of deposition coatings 250 through 256 from substrate 182. In this manner, it is possible to generate deposition coatings having desirable characteristics, which may be removed from the substrate after deposition of a suitable thickness.

Figure 9B:
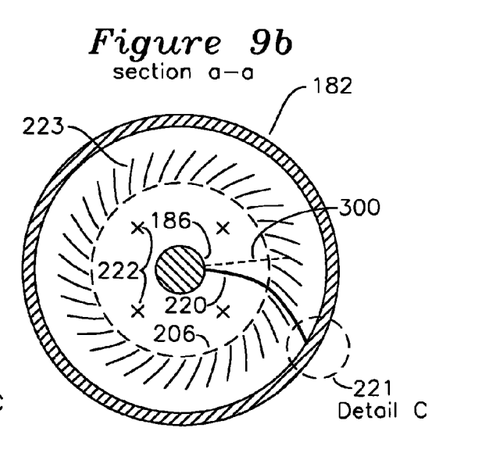
FIG. 9b shows a cross section view of an embodiment of FIG. 8 including a macro-particle trap outside a porous anode.

FIG. 9b shows the cross section view a-a of an alternative embodiment of FIG. 8. In this case, a passive mechanical macro-particle trap 223 is placed between the anode 206 and deposition substrate 182. The axial magnetic field 222 causes smaller particles to travel in a curved trajectory having a smaller radius of curvature, while the heavier particles tend to travel in more linear trajectories and are trapped by the micro particle filter 223, as shown for path 300. The angled vanes of the macro-particle filter 223 stop the macro-particles, while allowing the finer particles to continue through the vanes to the deposition surface, shown in trajectory 220. By filtering out the larger macro-particles and allowing the finer particles to continue, a more uniform deposition layer is created on substrate surface 182.

Figures 9C, 9D:
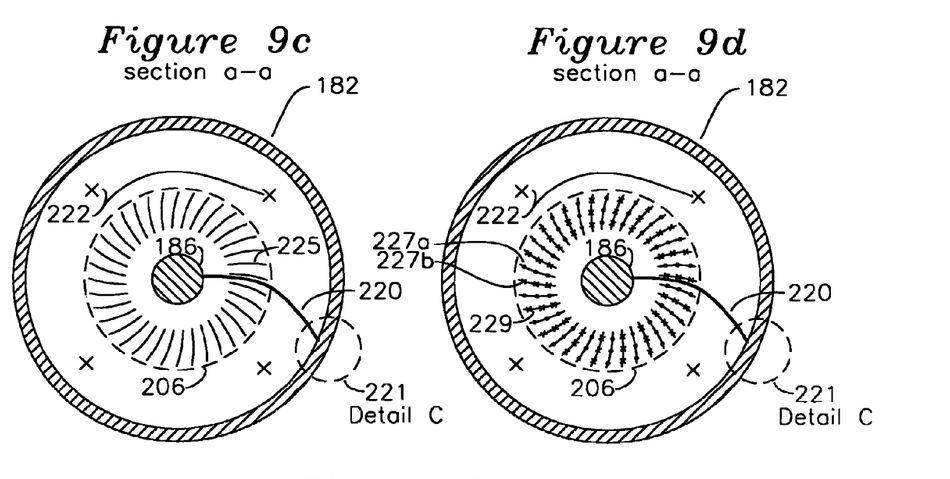
FIG. 9c shows a cross section view of an embodiment of FIG. 8 including a macro-particle trap inside a porous anode.
FIG. 9d shows a cross section view of an embodiment of FIG. 8 including a current-carrying micro particle trap.

FIG. 9c shows the cross section of another embodiment of FIG. 8, whereby the macro-particle trap 225 is located between the cathode 186 and anode 206, and operates as before. While the macro-particle trap 225 may be made from a non-conductive material, it is also possible for the macro-particle trap 225 to act as the anode electrode, in place of porous anode 206.

FIG. 9d shows a conductive macro-particle trap 229, which comprises a series of flat conductors, each carrying a current having the opposite sense of the adjacent flat conductor. In the example of FIG. 9d, the dot convention for current flowing out of the page and cross convention for current flowing into the page is used. In this manner, the currents flowing in each vane of the macro-particle filter 229 generates a radial magnetic field, whereby the ionized plasma follows the vane contour, and larger macro-particles follow trajectories which have a much larger radius of curvature, are stopped by the traps. In this manner, the desired finer plasma particles continue to the deposition surface of the substrate 182. The current required for the Lorentz force to effect the particles is usually in excess of 50 A for a radial macro-particle filter on the order of 100 mm in diameter.

Figure 9E:
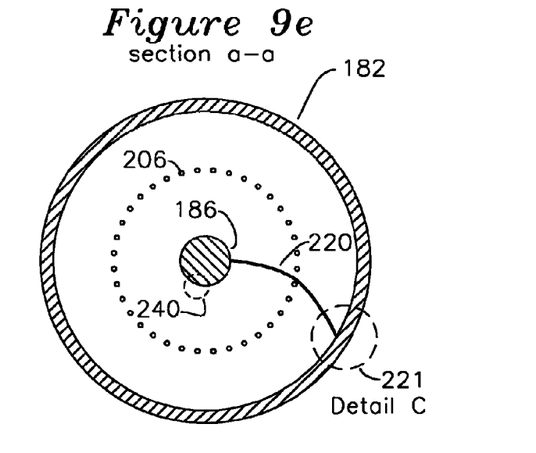
FIG. 9e shows an embodiment of FIG. 8 including a porous anode.
Figure 9F:
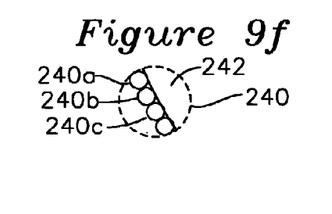
FIG. 9f shows an embodiment of a cathode made from a plurality of different materials.

FIG. 9e shows another alternative embodiment for the anode conductor 206 of the previous figures, where the porous anode comprises a plurality of individual conductors 206. As described earlier, the individual conductors 206 may also be fabricated from a plurality of conductors of different materials. FIG. 9f shows a cathode region 240 comprising a cathode 242 having a plurality of different material conductors 240a, 240b, 240c deposited on the surface such that reaction products from these conductors 240a, 240b, 240c combine with the gas to form the deposition layers with various chemical compositions. In this manner, the composition of surface conductors 240a, 240b, 240c may be varied to generate certain reaction products in combination with other reaction products.

It is clear that the embodiments of the present invention are intended only to show specific ways to practice the invention without limitation to the particular ways shown. For example, the porous conductor 206 may comprise an insulating material, or it may be a conductor which acts in conjunction with anode 206, or it may replace the anode 206. Additionally, it may carry current which causes an increased particle sorting effect as described for FIG. 9d. Independent of the other parameters, a porous anode 206 may be a porous sheet conductor such as a mesh, or it may be individual wires of the same or different composition, or the cathode may be formed from the same or different compositions as shown in FIG. 9f. The deposition surface may independently be configured for the deposition material to adhere, or to be removed. In this manner, any of the descriptive functions may be practiced separately, or in combination with other functions.

Figure 6:
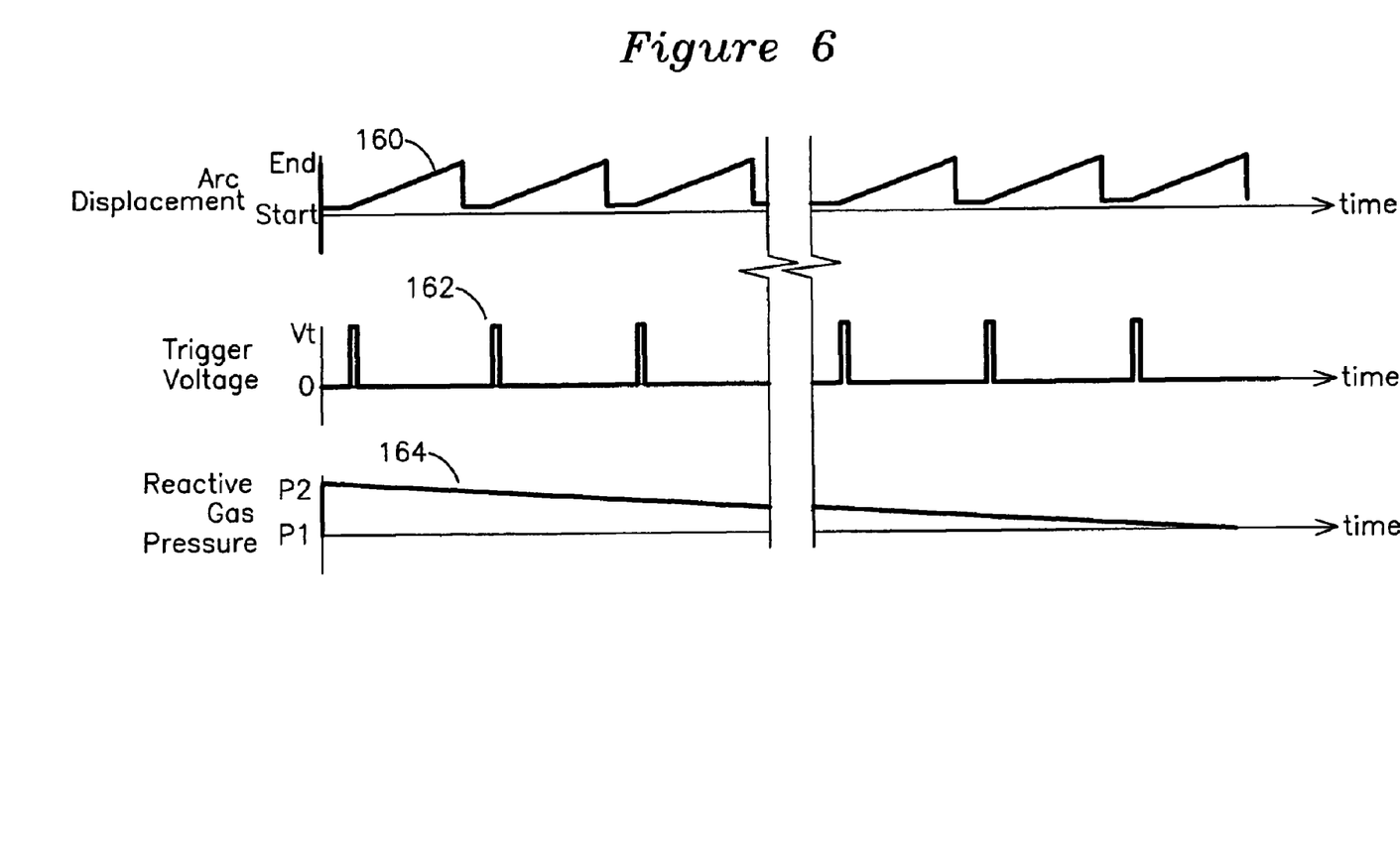
FIG. 6 shows the time progression of a succession of deposition cycles in the presence of varying gas pressure.

FIG. 6 shows the operation of the deposition apparatus over multiple coatings. Arc displacement curve 160 indicates the successive application of the plasma arc from a start location, which is typically at the plasma arc initiator 140 end of the anode 102, to an, end location that is typically at the electrode 119 end of the anode 102, both shown on FIG. 1. Trigger voltage waveform 162 shows the instantaneous application of the trigger voltage from trigger power supply 148 of FIGS. 1 and 3, which initiates the traveling plasma arc shown on waveform 160. As each successive arc deposition event occurs as shown in waveform 160, the gas pressure is varied from a start pressure P2 of curve 164 to an end pressure P1 of curve 164. This pressure may be increasing or decreasing, or vary in any manner for which the pressure results in reactive coatings suitable for each deposition event, as is discussed in detail below.

The plasma may form with only the gas 114 of FIG. 1 ionizing, or it may include reaction components of the gas 114 with the cathode 104. By selecting a reactive combination of the cathode material 104 and gas 114, it is possible to generate ionic particles with desired coating properties, as will be discussed later. As the plasma follows the helical path 120, particles comprising reactive products from the high current densities of cathodic spots are deposited on the inside surface of the anode 102. These particles are driven towards the anode 102, which is positive with respect to these particles, and the ionic particles of the plasma are attracted to the anode 102, and form a deposition layer on the inner surface of the cylindrical anode in the region of the plasma. Because the ionic particles impinge on this surface at high velocity, they mechanically key into and deposit onto the inner wall of the anode 102. The density of these ionic particles is controllable by the pressure of the gas 114. By varying the pressure of the gas 114 in the chamber 124 using pressure control valve 112, it is possible to vary the rate of deposition on the inner surface of anode 102.

A plasma arc is struck between the cathode and the anode using a trigger-less arc system. During the arc discharge event, the discharge current is localized in an area known as a cathode spot, which is of extremely high current density ($\sim 10^{12}$ A/m$^2$). This current density is associated with a correspondingly high areal power density ($\sim 10^{13}$ W/m$^2$) which provides the energy for a localized phase transformation from the solid to a fully ionized plasma. The characteristic time and dimension of cathode spots are in the sub-microsecond and micrometer range, respectively.

The plasma generated at the cathode spots rapidly expands into the ambient vacuum. In general, cathodic arc plasmas contain multiply ionized species. The ion charge state distributions for over 50 elements have been measured at Lawrence Berkeley National Laboratory and are presented in the form of a periodic table of material and plasma properties by Anders in IEEE Transactions on Plasma Science, Vol. 29, No. 2, April, 2001, 393-398. Notably, due to ion-electron coupling within the plasma, the final ion velocities fall within the range $1-3 \times 10^4$ m/s, seemingly independent of species and ion charge state. These directed velocities correspond to kinetic energies of approximately 20 eV or greater for low-Z elements and 200 eV for the high-Z elements. Furthermore, since the plasma is fully ionized, the kinetic energy of the ions may be controlled by adjusting the voltage drop across the cathode and anode. These high-energy ions are the most important reason for the improved film properties obtained by cathodic arc plasma deposition. Conventional evaporation and sputtering systems produce ion energies that are at least an order of magnitude lower than those of arc discharges. The higher deposition energy of the Coaxial Energy Deposition (CED) process tends to produce films that are denser and have better adhesion characteristics. The better adhesion of CED coatings is due to interface mixing, produced by the higher energy ions. Transmission Electron Microscope (TEM) images of the interface between a silicon substrate and a carbon coating deposited using a CED system show that the C atoms have penetrated several atomic diameters into the silicon, interlocking the two layers.

Figure 7:
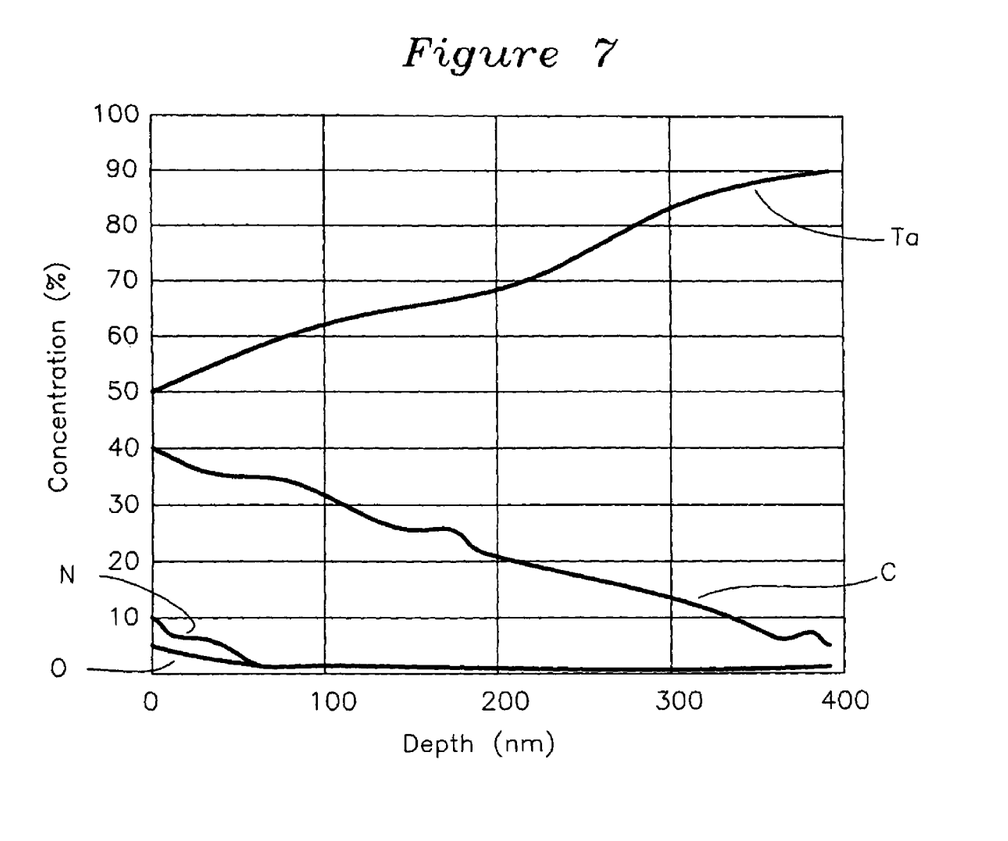
FIG. 7 shows the relative concentrations of Ta and C with depth in a ceramic layer formed using a Ta cathode and CH4 reactive gas.

Ceramics can be deposited in the CED process by introducing background gasses into the vacuum chamber. To deposit TaC, for instance, a Ta cathode is used while $CH_4$ flows into the chamber. The stoichiometry of the film is controlled by the partial pressure of the background gas. Tests have shown that to produce stoichiometrically correct 1:1 TaC requires a $CH_4$ partial pressure of about 100 mTorr. Reducing the gas pressure yields a film with a higher Ta to C ratio, where in the extreme, if no gas is introduced, pure Ta is deposited. This point is illustrated in FIG. 7, which is derived from Rubinshtein, A., Shneck, R., Raveh, A., Klemberg-Sapieha, J., Martinu, L., J. Vac. Sci. Technol. A 18 (4) Jul./Aug. (2000). FIG. 7 shows the relative concentrations of Ta and C in a ceramic layer produced using a plasma deposition system with $CH_4$ as the reactive gas. Note that at the surface, the stoichiometry of the film is almost 1:1, and that it changes nearly linearly to pure Ta with depth. The pressure control may be achieved many ways, including a precision needle valve or a mass flow valve, both of which may be controlled by a computer so the gas pressure and stoichiometry of the film can be precisely regulated as the film grows.

The control process for producing a linearly-graded coating may require using a mass flow valve (MFV) so that a computer can accurately control the background gas pressure as the process proceeds. While it may seem that the MFV should open linearly as the film grows to produce a linearly-graded coating, due to non-linear reaction dynamics, and due to the complex interaction between pumping-speed and pressure in vacuum systems, the required flow-rate will not likely be linear with film thickness and will need to be determined empirically.

An additional application for the CED process is to coat the inside surfaces of rocket nozzles. The CED process is ideal for applying high-temperature ceramics and metals to these cylindrically symmetric structures that vary in diameter along their length.

Another application is in the application of coatings to gun barrels. To increase their range and lethality, modern guns use new projectile designs with higher energy and temperature propellants that produce higher chamber pressures and gun-wall temperatures. These increasingly severe conditions lead to enhanced thermochemical erosion rates that limit the service life of present gun systems and may preclude the implementation of future more advanced designs. Some of the deleterious effects of these higher temperatures and pressures include increased reaction and diffusion rates, which enhance the formation of iron oxides, sulfides and carbonized iron. These materials have lower melting points and weaker mechanical properties than steel and thus are more easily removed, rapidly eroding the gun barrel surface. In addition, the higher temperatures can lead to direct melting of the gun steel, to metallurgical phase transitions, and to thermal and transformational stresses, which conspire to erode the barrel surface at unacceptably high rates. To be effective, these coatings must have excellent adhesion and cohesion, form good chemical and thermal barriers, and exhibit good mechanical properties. At present, the most common coating is electrodeposited chromium (Cr), either low-contractile (LC) Cr or high-contractile (HC) Cr. LC Cr is more desirable than HC Cr because fewer micro-cracks are formed during the deposition process. There are several drawbacks to Cr coatings. For one, the micro-cracks that are formed during the plating process, and additional cracks that form during the use of the gun, allow hot reactive gases to reach the underlying steel, producing erosion pits that undermine the Cr layer. For another, since Cr is deposited using electroplating, it is too thin to serve as an effective thermal barrier. Hence, it does not damp-out the thermal pulse generated by firing the gun, which leads to phase transitions and enhanced chemical transformations in the steel. These transformations promote cracking of the chromium and coating failure. If the chromium is plated thicker, the inherent tensile stresses and the low adhesive strength cause the coating to spall off. Finally, chromium's melting point is not as high as those of ceramic coatings or refractory metals such as tungsten. Other gun barrel coatings have been investigated, with refractor metals and ceramics being the most common. The advantage of ceramics is that they have extremely high melting points, excellent chemical resistance and are very hard. For example, tantalum carbide (TaC) has a melting point of about 3900° C. (7050° F.), over twice that of 4330-gun steel, and a Rockwell A hardness of 88, about 26% harder than gun steel. In addition, TaC is stable in strongly oxidizing environments, even at temperatures in excess of 800° C. (1470° F.).

The drawback of ceramic coatings in harsh environments has been poor adhesion at the metal interface and poor thermal and mechanical shock resistance. By using a linearly-graded ceramic-metal coating which is available through the variation of gas pressure during the coating process, as described in the present invention, these mechanical properties will improve. For example, the coating will have better adhesion since a pure metal, such as tantalum (Ta), is in contact with the steel barrel rather than with the ceramic. The cohesion of the film is very good, since it transitions smoothly through a mixed ceramic-metal matrix, and therefore, there is no preferential interface to initiate delamination. The smooth transition also improves the shock resistance of the coating, as the ceramic-metal matrix should be more ductile than the pure ceramic.

The Coaxial Energy Deposition process may be used to deposit ceramic films on the inside of ethylene cracking tubes that are used in olefin manufacturing. These cracking tubes are subjected to extreme conditions, similar in many respects to those conditions found in gun barrels. For example, the ethylene cracking tubes run at temperatures in excess of 1100 C. Hot, corrosive gases, containing hydrocarbon, sulfur and nitrogen compounds, flow through the tubes at high velocity. Many of the same corrosive effects and metallurgical phase transitions that are observed in gun barrels are also observed in these tubes.

There are many advantages to the CED process for coating the inside of tubes. The absence of moving parts makes the process relatively inexpensive to implement—all that is needed is a vacuum chamber and two power supplies. The CED process can be used to coat tubes of almost any length and of a wide range of diameters. The process is also efficient, producing minimal heating of the substrate and vacuum chamber, in contrast with the prior art approaches, many of which require water cooling of the components.

Another major advantage of the CED process is that the deposition ions are more energetic than the ions produced in CVD, electroplating or sputtering systems. Hence, CED films tend to have better adhesion, higher densities, and fewer cracks and voids than films produced using these other methods. The better adhesion characteristics of CED films is a result of surface intermixing due to the impact of the energetic ions. In addition, films deposited using the CED process tend to be under compressive stress, which also promotes good adhesion and cohesion.

We claim:

1. An apparatus for the deposition of an evaporated material from a stationary cathode onto a stationary cylindrical anode using a plasma, said apparatus comprising:
   an enclosed chamber including a vacuum pump and a variable pressure gas source;
   said cathode formed from a first conductive material and placed about an axis;
   said cylindrical anode formed from a second conductive material, said cylindrical anode placed at a positive electrical potential with respect to said cathode, said anode having a substantially constant inner radius which is greater than an outer radius of said cathode;
   a particle trap having a plurality of radial vanes, each said radial vane formed by the locus of points between a start point located at a first radial distance from said axis and an ending point at a second radius greater than the first radius from said axis, said start point and said end point forming an included angle with respect to said axis, where said included angle is selected to cause a particle traveling on a linear path from said cathode to said anode to collide with and be trapped by one of said plurality of radial vanes;
   where adjacent said radial vanes of said particle trap carry a steering current travelling substantially parallel to said axis and of opposite polarity on adjacent said radial vanes;
   a magnetic field generator providing a uniform and unidirectional magnetic field parallel to said axis over the extent of said anode;
   whereby a voltage applied between said cylindrical anode and said cathode causes said plasma to form substantially radially between said cathode and said anode, said plasma thereafter moving helically along the extent of said axis under the influence of said magnetic field, thereby causing ions with curved trajectories from said plasma to deposit on said anode and macroparticles with linear trajectories to deposit on said particle trap.

2. The apparatus of claim 1 where said gas is carbon based.

3. The apparatus of claim 2 where at least one said gas is Acetylene or Benzene.

4. The apparatus of claim 1 where said gas source includes at least one of tetrafluoromethane, nitrogen trifluoride, or fluorine.

5. The apparatus of claim 1 where said first conductive material is a homogeneous material.

6. The apparatus of claim 5 where said first conductive material includes at least one of Magnesium, Boron, or Tin.

7. The apparatus of claim 1 where said first conductive material is an alloy.

8. The apparatus of claim 1 where said first conductive material is a sintered powder.

9. The device of claim 1 where said first conductive material is from the family of intermetallics.

10. The device of claim 1 where said first conductive material contains at least one of $Nb_3Sn$, NbTi, Magnesium Diboride, or TaW.

11. The device of claim 1 where said cylindrical anode is formed from a plurality of individual wires.

12. The device of claim 11 where said plurality of wires is formed from a homogeneous material.

13. The device of claim 11 where said individual wires are in electrical contact with each other.

14. The device of claim 11 where said wires are connected together at a terminal end, and have separation gaps along the extent of said anode.

15. The device of claim 1 where said plasma produces a removable coating on an inner deposition surface of said cylindrical anode.

16. The device of claim 15 where said deposition surface of said cylindrical anode is smooth, thereby providing reduced adhesion for a removable coating deposited thereon.

17. The device of claim 15 where the current in said radial vanes is sufficient to increase the trapping of macroparticles.

18. The device of claim 15 where said coating adheres to said cylindrical anode.

19. The device of claim 15 where said coating is removable from said outer electrode after a deposition.

20. The device of claim 15 where said coating comprises successive graded coatings of materials, at least one successive coating has a different composition.

21. The device of claim 20 where said at least one successive coating has said composition selected to increase mechanical adherence between a previous said coating material and a successive coating material.

22. The device of claim 1 where said steering current is selected to increase the trapping of macroparticles.

23. The device of claim 1 where said steering current is selected to direct plasma ions through said trap.

24. The device of claim 1 where said steering current is sufficient to generate a magnetic field which causes ionized particles to follow the passages between said radial vanes and to trap macroparticles.

25. An apparatus for the deposition of an evaporated material from a cathode to a deposition surface beyond the radial extent of a porous anode using a plasma, said apparatus comprising:
   an enclosed chamber including a vacuum pump and a variable pressure gas source;
   said cathode formed from a first conductive material and placed on an axis having an axial extent;
   said porous anode formed from a second conductive material, said porous anode placed at a positive electrical potential with respect to said cathode and surrounding said cathode over said axial extent;
   a magnetic field generator providing a magnetic field parallel to said axis over said axial extent, said magnetic field being substantially unidirectional and substantially uniform in strength over said axial extent;
   an ion trap located between said cathode and said deposition surface, said ion trap having passages with a radial extent sufficient to trap particles having a trajectory outside a range of trajectories, and whereby ions which travel in a linear trajectory are trapped by said passages and ions which travel in a curved trajectory pass freely, said ion trap having a plurality of elongate vanes, each said vane extending continuously from a first point beyond the extent of said cathode electrode to a second point separated from said first point and also rotated circumferentially about said axis with respect to said first point, said plurality of vanes thereby providing a plurality of passages therebetween for the unimpeded passage of particles within said range of trajectories;

where adjacent said elongate vanes of said ion trap carry a steering current travelling substantially parallel to said axis and of opposite polarity on adjacent said elongate vanes;

a voltage applied between said cylindrical anode and said cathode creating and maintaining said plasma;

whereby ions of said plasma travel from said cathode through said porous anode and to said deposition, and other ions which follow a radial trajectory outside said range are captured by said ion trap.

26. The apparatus of claim 25 where said porous anode is cylindrical.

27. The apparatus of claim 25 where said porous anode has a substantially elliptical cross section perpendicular to said axis.

28. An apparatus for the deposition of an evaporated material from a cathode having a continuous outer surface onto the inner continuous surface of a cylindrical anode using a plasma, said apparatus comprising:

an enclosed chamber including a vacuum pump and a variable pressure gas source;

said cathode formed from a first conductive material and placed on an axis;

said cylindrical anode formed from a second conductive material, said cylindrical anode placed at a positive electrical potential with respect to said cathode, said cathode positioned within said cylindrical anode over an axial extent of said axis;

a macro-particle filter disposed between said cathode and said anode, said macro-particle filter having continuously formed vanes separated from other said vanes, the gap between said vanes forming passages having sufficient radial extent to trap plasma particles having a linear trajectory, and to allow the passage of particles having the trajectory of an arc with curvature in a single direction;

a magnetic field generator providing a magnetic field parallel to said axis over said axial extent, said magnetic field being substantially unidirectional and substantially uniform over said axial extent where said continuously formed vanes of said macro-particle filter are arranged substantially parallel to said axis and carry a steering current of opposite polarity on adjacent said continuous radial vanes, said steering current generating a magnetic field sufficient to cause said macro-particle filter to guide the passage of ionized plasma particles through said continuous radial vanes, and to trap macroparticles.

29. The apparatus of claim 28 where said macro-particle filter comprises a plurality of substantially radial vanes having an extent greater than said anode radius and less than said deposition surface radius.

30. The apparatus of claim 29 where each said radial vane carries a current opposite in sense to an adjacent said radial vane.

31. The apparatus of claim 29 where said cylindrical anode is formed from a plurality of individual wires.

32. The apparatus of claim 29 where each said radial vane is linear in cross section, and located to block particles that are traveling substantially linearly from said cathode to said deposition surface.

33. The apparatus of claim 29 where at least one said radial vane has a curvature which substantially matches the trajectory of a fine particle of said plasma.

34. The apparatus of claim 29 where at least one said vane has a curvature which substantially blocks the trajectory of a macro-particle of said plasma.

35. The apparatus of claim 28 where said macro-particle filter is located in the region between an outer surface of said cathode and an inner surface of said anode.

36. The apparatus of claim 28 where said macro-particle filter is located between said anode and said deposition surface.

37. The apparatus of claim 28 where said macro-particle filter is electrically continuous with and adjacent to said anode.

38. The device of claim 11 where said plurality of wires is formed from different materials.

* * * * *